(12) United States Patent
Tanikella et al.

(10) Patent No.: US 7,919,815 B1
(45) Date of Patent: Apr. 5, 2011

(54) SPINEL WAFERS AND METHODS OF PREPARATION

(75) Inventors: Brahmanandam Tanikella, Northboro, MA (US); Elizabeth Thomas, Southington, OH (US); Frank L. Csillag, Hopkinton, MA (US); Palaniappan Chinnakaruppan, Springboro, OH (US); Jadwiga Jaroniec, Stow, OH (US); Eric Virey, Portland, OR (US); Robert A. Rizzuto, Worcester, MA (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 1363 days.

(21) Appl. No.: 11/365,465

(22) Filed: Mar. 1, 2006

Related U.S. Application Data (63) Continuation of application No. 11/065,397, filed on Feb. 24, 2005, now abandoned.

(51) Int. Cl.
*H01L 27/01* (2006.01)
*H01L 27/12* (2006.01)
*H01L 31/0392* (2006.01)
*H01L 23/58* (2006.01)

(52) U.S. Cl. . 257/352; 257/629; 257/631; 257/E21.121; 438/974

(58) Field of Classification Search ............... 257/629, 257/631, 352, E21.121; 438/974
See application file for complete search history.

(56) References Cited

U.S. PATENT DOCUMENTS

| | | | |
|---|---|---|---|
| 2,634,554 A | 4/1953 | Barnes et al. | |
| 3,424,955 A | 1/1969 | Seiter et al. | |
| 3,625,868 A | 12/1971 | Grabmaier et al. | |
| 3,655,439 A | 4/1972 | Seiter | |
| 3,658,586 A | 4/1972 | Wang | |
| 3,736,158 A * | 5/1973 | Cullen et al. | 501/86 |
| 3,753,775 A | 8/1973 | Robinson et al. | |
| 3,796,597 A | 3/1974 | Porter et al. | |
| 3,802,967 A * | 4/1974 | Ladany et al. | 257/183 |
| 3,808,065 A * | 4/1974 | Robinson et al. | 216/101 |
| 3,808,836 A | 5/1974 | Jones | |
| 3,816,906 A | 6/1974 | Falckenberg | |
| 3,876,382 A * | 4/1975 | Falckenberg | 117/207 |
| 3,883,313 A * | 5/1975 | Cullen et al. | 117/19 |
| 3,885,978 A | 5/1975 | Doi et al. | |
| 3,898,051 A | 8/1975 | Schmid | |
| 3,950,504 A | 4/1976 | Belding et al. | |

(Continued)

FOREIGN PATENT DOCUMENTS

CN    1291795    4/2001

(Continued)

OTHER PUBLICATIONS

Anon., "Spinel Crystals for Electronic Devices", Manufacturing Technology Note, vol. NTN-77, No. 0735, Apr. 1977, XP-002315747.

(Continued)

*Primary Examiner* — Ida M Soward (57) ABSTRACT

Wafer suitable for semiconductor deposition application can be fabricated to have low bow, warp, total thickness variation, taper, and total indicated reading properties. The wafers can be fabricated by cutting a boule to produce rough-cut wafers, lapping the rough-cut wafers, etching the lapped wafers to remove a defect, deformation zone and relieve residual stress, and chemically mechanically polishing the etched wafers to desired finish properties. Etching can be performed by immersion in a heated etching solution comprising sulfuric acid or a mixture of sulfuric and phosphoric acids. A low pH slurry utilized in chemical mechanical polishing of the spinel wafer can comprise $\alpha\text{-}Al_2O_3$ and an organic phosphate.

8 Claims, 8 Drawing Sheets

U.S. PATENT DOCUMENTS

| | | | |
|---|---|---|---|
| 3,964,942 A | 6/1976 | Berkenblit et al. | |
| 3,990,902 A | 11/1976 | Nishizawa et al. | |
| 4,000,977 A | 1/1977 | Falckenberg | |
| 4,177,321 A | 12/1979 | Nishizawa | |
| 4,347,210 A | 8/1982 | Maguire et al. | |
| 4,370,739 A | 1/1983 | Wang et al. | |
| 4,404,265 A * | 9/1983 | Manasevit | 428/689 |
| 4,493,720 A | 1/1985 | Gauthier et al. | |
| 4,624,901 A * | 11/1986 | Glass | 428/469 |
| 4,627,064 A | 12/1986 | Auzel et al. | |
| 4,649,070 A | 3/1987 | Kondo et al. | |
| 4,657,754 A | 4/1987 | Bauer et al. | |
| 4,755,314 A | 7/1988 | Sakaguchi et al. | |
| 4,819,167 A | 4/1989 | Cheng et al. | |
| 4,963,520 A | 10/1990 | Yoo et al. | |
| 5,138,298 A | 8/1992 | Shino | |
| 5,530,267 A | 6/1996 | Brandle, Jr. et al. | |
| 5,557,624 A | 9/1996 | Stultz et al. | |
| 5,643,044 A | 7/1997 | Lund | |
| 5,644,400 A | 7/1997 | Mundt | |
| 5,654,973 A | 8/1997 | Stultz et al. | |
| 5,741,724 A | 4/1998 | Ramdani et al. | |
| 5,742,026 A | 4/1998 | Dickinson, Jr. et al. | |
| 5,750,434 A * | 5/1998 | Urushidani et al. | 438/478 |
| 5,768,335 A | 6/1998 | Shahid | |
| 5,802,083 A | 9/1998 | Birnbaum | |
| 5,822,213 A | 10/1998 | Huynh | |
| 5,825,913 A | 10/1998 | Rostami et al. | |
| 5,850,410 A | 12/1998 | Kuramata | |
| 5,968,267 A | 10/1999 | Li | |
| 5,982,796 A | 11/1999 | Kokta et al. | |
| 5,989,301 A | 11/1999 | Laconto, Sr. et al. | |
| 6,021,380 A | 2/2000 | Fredriksen et al. | |
| 6,023,479 A | 2/2000 | Thony et al. | |
| 6,048,577 A | 4/2000 | Garg | |
| 6,104,529 A | 8/2000 | Brandle, Jr. et al. | |
| 6,211,088 B1 * | 4/2001 | Masuda et al. | 438/691 |
| 6,238,450 B1 | 5/2001 | Garg et al. | |
| 6,258,137 B1 | 7/2001 | Garg et al. | |
| 6,265,089 B1 | 7/2001 | Fatemi et al. | |
| 6,364,920 B1 | 4/2002 | Garg et al. | |
| 6,366,596 B1 | 4/2002 | Yin et al. | |
| 6,391,072 B1 | 5/2002 | Garg | |
| 6,406,769 B1 | 6/2002 | Delabre | |
| 6,418,921 B1 | 7/2002 | Schmid et al. | |
| 6,533,874 B1 | 3/2003 | Vaudo et al. | |
| 6,586,342 B1 * | 7/2003 | Mayer et al. | 438/754 |
| RE38,489 E | 4/2004 | Thony et al. | |
| 6,839,362 B2 | 1/2005 | Kokta et al. | |
| 6,844,084 B2 | 1/2005 | Kokta et al. | |
| 6,846,434 B2 | 1/2005 | Akselrod | |
| 7,045,223 B2 * | 5/2006 | Kokta et al. | 428/702 |
| 7,301,223 B2 * | 11/2007 | Rodney et al. | 257/629 |
| 7,326,477 B2 * | 2/2008 | Stone-Sundberg et al. | 428/702 |
| 7,332,031 B2 * | 2/2008 | Tischler et al. | 117/97 |
| 2001/0026950 A1 | 10/2001 | Sunakawa et al. | |
| 2002/0028314 A1 | 3/2002 | Tischler et al. | |
| 2002/0030194 A1 | 3/2002 | Camras et al. | |
| 2002/0086534 A1 * | 7/2002 | Cuomo et al. | 438/689 |
| 2003/0007520 A1 | 1/2003 | Kokta et al. | |
| 2003/0170920 A1 * | 9/2003 | Bhagavat et al. | 438/14 |
| 2003/0188678 A1 * | 10/2003 | Kokta et al. | 117/2 |
| 2003/0190770 A1 | 10/2003 | Yeom et al. | |
| 2003/0213950 A1 | 11/2003 | Hwang | |
| 2004/0063236 A1 | 4/2004 | Kwak et al. | |
| 2004/0089220 A1 | 5/2004 | Kokta et al. | |
| 2004/0089919 A1 * | 5/2004 | Motoki et al. | 257/613 |
| 2004/0216388 A1 * | 11/2004 | Mathur et al. | 51/298 |
| 2005/0014097 A1 * | 1/2005 | Tailhades et al. | 430/270.12 |
| 2005/0014347 A1 * | 1/2005 | Tomita et al. | 438/459 |
| 2005/0061230 A1 * | 3/2005 | Kokta et al. | 117/11 |
| 2005/0061231 A1 * | 3/2005 | Stone-Sundberg et al. | 117/13 |
| 2005/0103257 A1 * | 5/2005 | Xu et al. | 117/84 |
| 2005/0126471 A1 * | 6/2005 | Jenny et al. | 117/92 |
| 2005/0130394 A1 * | 6/2005 | Falster | 438/480 |
| 2005/0161697 A1 * | 7/2005 | Nakahata et al. | 257/103 |

FOREIGN PATENT DOCUMENTS

| | | |
|---|---|---|
| CN | 1379484 | 11/2002 |
| CN | 1469459 | 1/2004 |
| CN | 1476046 | 2/2004 |
| CN | 1476047 | 2/2004 |
| DE | 1619809 A1 | 8/1970 |
| DE | 1619809 B * | 12/1975 |
| EP | 0 148 656 A1 | 7/1985 |
| EP | 0 263 171 B1 | 4/1988 |
| EP | 0 762 930 B1 | 3/1997 |
| EP | 997445 | 5/2000 |
| EP | 1298709 | 4/2003 |
| EP | 1394867 | 3/2004 |
| FR | 1471976 | 3/1967 |
| JP | 50-12970 | 2/1975 |
| JP | 53-043481 | 4/1978 |
| JP | 53038968 A | 4/1978 |
| JP | 79-026873 | 9/1979 |
| JP | 58-090736 | 5/1983 |
| JP | 58-211736 | 12/1983 |
| JP | 61-142759 | 6/1986 |
| JP | 62-123059 | 6/1987 |
| JP | 62-188325 | 8/1987 |
| JP | 7-235692 | 9/1995 |
| JP | 07-307316 | 11/1995 |
| JP | 8-040797 | 2/1996 |
| JP | 8-083802 | 3/1996 |
| JP | 8-095233 | 4/1996 |
| JP | 08-316571 A | 11/1996 |
| JP | 9-129651 | 5/1997 |
| JP | 9-129928 | 5/1997 |
| JP | 09-278595 | 10/1997 |
| JP | 11-157997 | 6/1999 |
| JP | 11-195813 | 7/1999 |
| JP | 11-235659 | 8/1999 |
| JP | 11-274559 | 10/1999 |
| JP | 2000-216502 | 8/2000 |
| JP | 2000-228367 | 8/2000 |
| JP | 2000-331940 | 11/2000 |
| JP | 2001-010898 | 1/2001 |
| JP | 2001-080989 A | 3/2001 |
| JP | 2001-198808 | 7/2001 |
| JP | 2001-220295 | 8/2001 |
| JP | 2001-253800 | 9/2001 |
| JP | 2002-012856 | 1/2002 |
| JP | 2002-050577 | 2/2002 |
| JP | 2002-084035 | 3/2002 |
| JP | 2002-158377 | 5/2002 |
| JP | 2002-255694 | 9/2002 |
| JP | 2002-353425 | 12/2002 |
| JP | 2003-045829 | 2/2003 |
| JP | 2003-113000 | 4/2003 |
| JP | 2003-124151 | 4/2003 |
| JP | 2003-165042 | 6/2003 |
| JP | 2003-273022 | 9/2003 |
| JP | 2003-320521 | 11/2003 |
| JP | 2003-334754 | 11/2003 |
| JP | 2003-338638 | 11/2003 |
| JP | 2004-006867 | 1/2004 |
| JP | 2004-014691 | 1/2004 |
| JP | 2004-140394 | 5/2004 |
| KR | 2002-043128 | 6/2002 |
| RU | 1781271 | 12/1992 |
| TW | 550836 | 9/2003 |
| WO | WO 00/68332 | 11/2000 |
| WO | WO 01/99155 A2 | 12/2001 |
| WO | WO 02/92674 | 11/2002 |
| WO | WO 02/095887 A2 | 11/2002 |
| WO | 03/084886 A1 | 10/2003 |
| WO | WO 2004/033769 | 4/2004 |
| WO | 2005/031046 A1 | 4/2005 |
| WO | 2005/031047 A1 | 4/2005 |
| WO | 2005/031048 A1 | 5/2008 |

OTHER PUBLICATIONS

Birnbaum M., et al., "Co2+: ZnSe Saturable Absorber Q-Switch for the 1.54 Um Er3+:Yb3+: Glass Laser," OSA TOPS vol. 10 Advanced Solid State Lasers, pp. 148-151 (1997).

Camargo, M.B., et al., "Broad-band 1.54 um Saturable Absorber Q-switch with Co2+," submitted to ASSL in 1995.
Camargo, M.B., et al., "Co2+ Y3Sc2Ga3O12 (YSGG) Passive Q-Switch for Infared Erbium Lasers," submitted to LEOS in 1994.
Duan, S., et al., "MOVPE growth of GaN and LED on (1 1 1) MgAl2O4", Journal of Crystal Growth, vol. 189/190, pp. 197-201, 1998.
Efimov, A.N., et al., "On an Unusual Azimuthal Orientation Relationship in the System Gallium Nitride Layer on Spinal Substrate", Crystallography Reports, 45(2): 312-317 (2000).
Efimov, A.N., et al., "Symmetry constraints and epitaxial growth on non-isomorphic substrate", Thin Solid Films 260: 111-117 (1995).
George, T., et al., "Novel symmetry in the growht of gallim nitride on magnesium aluminate substrates", Appl. Phys. Lett. 68(3): 337-339 (1996).
Giess et al., "Growth of Single Crystal MgGa2O4 Spinel", IBM Technical Disclosure Bulletin, vol. 15, No. 1, Jun. 1972, pp. 151-152, XP-002315746.
Grabmaier, et al., "Czochralski Growth of Magnesium-Aluminum Spinel", J. American Ceramic Society, vol. 51, No. 6, Jun. 1968, pp. 355-356, XP-002315185.
Gritsyna, V., et al., "Structure and Electronic states of defects in spinel of different compositions MgO • n MgAl2O3 :Me", J. Am. Ceram. Soc. vol. 82. No. 1, pp. 3365-3373, 1999.
Haisma, et al., "Lattice constant adaptable crystallographics", Journal of Crystal Growth, vol. 102, pp. 979-993, 1990. XP002250056.
Hellman, E., "Exotic and Mundane substrates for gallium nitride heteroepitaxy", Bell Laboratories, THC2, Murray Hill, NJ.
Khan, M.A., et al., "Cleaved cavity optically pumped InGaN-GaN laser grown on spinel substrates," Appl. Phys. Lett. 69(16): 2418-2420 (1996).
Kisailus D., et al., "Growth of Epitaxial GaN of LiGaO2 Substrates Via a Reaction With Ammonia", J. Mater. Res., vol. 16, No. 7, pp. 2077-2081, 2001.
Kruger, M.B., et al., "Equation of state of MgAl2O4 spinel to 65 GPa", The American Physical Society, vol. 56, No. 1, pp. 1-4, 1997.
Kuleshov, N.V., et al. "Co-doped spinels: promising materials for solid state lasers", Longer Wavelength Lasers and Applications, vol. 2138, pp. 175-182, 1994. XP008017848.
Kuleshov, N.V., et al., Absorption and luminescence of tetrahedral Co2+ ion in MgAl2O4, vol. 55, No. 5-6, pp. 265-269, 1993. XP008017849.
Kuramata, Akito, et al., "Properties of GaN Epitaxial Layer Grown on (1 1 1) MgAl2O4 Substrate", Solid State Electronics, vol. 41, No. 2, pp. 251-254, 1997.
Kuramata, Akito, et al., "High-quality GaN epitaxial layer grown by metalorganic vapor phase epitazy on (111) MgAl2O4 substrate", Appl. Phys. Lett., vol. 67, No. 17, pp. 2521-2523. 1995.
Machida, H., et al., "Difficulties encoutered during the Czochralxki growth of TiO2 single crystals," Journal of Crystal Growth, 112: 835-837 (1997).
Mikhailov, V.P., et al., "Passive Q-switch performance at 1.3u (1.5u) and nonlinear spectroscopy of Co2+: MgAl2O4 and Co2+: LaMgAl11O9 crystals," OSA TOPS vol. 26 Advanced Solid-State Lasers, pp. 317-324 (1999).
Mitchell, T., "Dislocations and Mechanical Properties of MgO-MgAl2O3 spinel single crystals", J. Am. Ceram. Soc., vol. 82, No. 12, pp. 3305-3316, 1999.
Mordoc, H., et al., "Large-band-gap SiC, III-V nitride, and II-vi ZnSe-based Semiconductor Device Technologies", J. Appl. Phys., vol. 76, No. 3, pp. 1363-1398, 1994.
Nakamura, S., et al., "Characteristics of InGaN multi-quantum-well-structure laser diodes," Appl. Phys. Lett. 68(23): 3269-3271 (1996).
Nakamura, S., et al., "InGaN MQW LDs Grown on MgAl2O4 Substrates," In The Blue Laser Diode, (NY: Springer-Verlag), pp. 233-243, 1997 (update included).
Nikishin, S.A., et al., "Gas source molecular beam epitaxy of GaN with hydrazine on spinel substrates", Applied Physics Letters, vol. 72, No. 19, pp. 2361-2363, 1998. XP000755963.
Ohsato, H., et al., "Epitaxial orientation and a growth model of (0 0 • 1) GaN thin film on (1 1 1) spinel substrate", Journal of Crystal Growth, vol. 189/190, pp. 202-207, 1998.
Oktyabrsky, S., et al., "Crystal structure and defects in nitrogen-deficient GaN", MRS Internet J. Nitride Semicond. Res, G6.43, pp. 1-6, 1999.
Pinckney, L.R., "Transparent, high strai point spinel glass-ceramics", Journal of Non-Crystalline Solids, vol. 255, pp. 171-177, 1999.
Sheldon, R., et al., "Cation Disorder and Vacancy Distribution in Nonstoichiometric Magnesium Aluminate Spinel, MgO • Al2O3", J. Am. Ceram. Soc., vol. 82, No. 12, pp. 3293-3298, 1999.
Stulz, R.D., et al., "Diavalent Uranium and Cobalt Saturable Absorber Q-Switches at 1.5um," OSA Proceedings on Advanced Solid-State Lasers, 24:460-464 (1995).
Sun, C.J., et al., "Mg-doped green light emitting diodes over cubic (1 1 1) MgAl2O4 substrates", App. Phys. Lett. 72(11): 1444-1446 (1997).
Sun, C.J., et al., "Deposition of high quality wurtzite GaN films over cubic (1 1 1) MgAl2O4 substrates using low pressure and metalorganic chemical vapor deposition," Appl. Phys. Lett. 68(8): 1129-1131 (1996).
Tamura, K., et al., "Epitaxial growth of ZnO film on lattice-matched ScAlMgO4 (0001) substrates", Journal of Crystal Growth, vol. 214-215, pp. 59-62, 2000. XP004200964.
Tempel, A., et al., "Nachweis von Stapelfehlern in GaN-Exitaxieschichten mittels Elecktronenbeugung," Kristall und Technik 10(7): 741-746 (1975).
Tempel, A., et al., "Zur Epitaxie von Galliumnitride auf nichtstoechiometrischem Spinell im System GaC1/NH3/He," Kristall und Technick 10(7): 747-758 (1975).
Tsuchiya, T., et al. "Epitaxial growth of InN films on MgAl2O4 (1 1 1) substrates", Journal of Crystal Growth, vol. 220, pp. 185-190, 2000.
Wyon, et al., "Czochralshi growth and optical properties of magnesium-aluminum spinel doped with nickel", Journal of Crystal Growth, vol. 79, pp. 710-713, 1986. XP002250057.
Yang, H. -F., et al., "Microstructure evolution of GaN buffer layer on MgAl2O4 substrate", Journal of Crystal Growth, vol. 193, pp. 478-483, 1998.
Yumashev, K.V., et al., "Passive Q-switching of 1.34-m neodymium laser using Co2+:LiGa5O8 and Co2+:MgAl2O4", Conference Digest, 2000, 1 page. XP002242959.
Yumashev K.V.,et al., "Co2+-doped spinels saturable absorber Q-switches for 1.3-1.6 •m solid state lasers", OSA Trends in Optcs and Photonics. Advanced Solid State Lasers., vol. 34, pp. 236-239, 2000. XP008017966.
Yumashev K.V., "Saturable absorber Co2+: MgAl2O3 crystal for Q switching of 1.34-um Nd3+:YAIO3 and 1.54-um Er3+: glass lasers," Applied Optics 38(30): 6343-6346 (1999).
Yumashev, K.V., et al., "Nonlinear spectroscopy and passive Q-switching operation of a Co2+: LaMgAl11O19 crystal," J. Opt. Soc. Am. B., 16(12): 2189-2194 (1999).
Khattak, C., et al., "Production of Sapphire Blanks and Substrates for Blue LEDs and LDs", Mat. Res. Soc. Symp.—Proceedings, V. 743, pp. 219-224, 2002 (Abstract Only).
Gutsche, H., et al., "Polishing of Sapphire with Colloidal Silica", Journal of the Electrochemical Society, vol. 125, No. 1, 1978, pp. 136-138, 1978. (Abstract Only).
Duffy, M., et al., "Semiconductor Measurement Technology: Method to Determine the Quality of Sapphire, (NOTE) Final Report", RCA Labs, 1980, 77 pgs. (Abstract Only).
Duffy, M., et al, "Method to Determine Qulity if Sapphire, (NOTE) Interim Rept.", RCA Labs, 1975, 88 pgs. (Abstract Only).
Horie, S., et al., "Precision Grinding of Semiconductor—Related Materials", (Journal) New Diamond, vol. 20, No. 2, pp. 8-13, 2004. (Abstract Only).
Edgar, J., et al., "Substrates for Gallium Nitride Epitaxy", Mat. Sci. & Eng., Part R, vol. R37, No. 3, pp. 61-127, 2002. (Abstract Only).
Aeschlimann, R. et al., "The Chemical Polishing of Magnesium Aluminate Spinel in Pyrophosphoric Acid", Mat. Res. Bull., vol. 5, pp. 167-172, 1970.
Dwikusuma, F., "Study on Sapphire Surface Preparation for III-Nitride Heteroepitaxial Growth by Chemical Treatments", Journal for Electrochemical Soc., Nov. 2002, 30 pgs.
Kim, S. et al., "Stress Relaxation in Thick-Film GaN Grown by Hydride Vapor Phase Epitaxy on Sapphire and Spinel Substrates as Studied by Photoluminescence and Raman Spectroscopy", J. of the KR Phys Soc., vol. 34, No. 2, Feb. 1999, pp. 163-167.
Kurobe, Toshiji, et al., "Magnetic Field-Assisted Lapping", Bull. Japan Soc. of Prec. Engg., vol. 20, No. 1, Mar. 1986, pp. 49-51.
Libowitzky, E., "Optical Anisotropy in the Spinel Group: a Polishing Effect", Eur. J. Mineral., vol. 6, 1994, pp. 187-194.
Reisman, A., et al., "The Chemical Polishing of Sapphire and MgAl Spinel", J. Electrochem. Soc.: Solid State Science, vol. 118, No. 10, Oct. 1971, pp. 1653-1657.
Richter, F., et al., "Herstellung und Aurichtung Von MgAl-Spinell-Substraten fur die Halbleiterepitaxie", Kristall und Technik, vol. 10, No. 3, 1975, pp. 33-348.
Robinson, P., et al., "The Chemical Polishing of Sapphire and Spinel", RCA Review, vol. 34, Dec. 1973, pp. 616-629.
Roy, D., et al., "Spinel, Where did it go?", SPIE vol. 3134, pp. 307-316.
Wang, C., et al., "Growth and Charcaterization of Spinel Single Crystal for Substrate Use in Integrated Electronics", J. Applied Physics, vol. 40, No. 9, Aug. 1969, pp. 3433-3444.
Yanina, S., et al., "Moving Steps and Crystal Defects on Spinel Surfaces", Mat. Res. Soc. Symp., vol. 620, 2000, pp. M9.4.1-M9.4.6.
Byun, D., et al., "Reactive ion (N2+) Beam Pretreatment of Sapphire for GaN Growth", Thin Solid Films, vol. 326, 1998, pp. 151-153.
Byun, D., et al., "New Pretreatment Method of Sapphire for GaN Deposition", Phys. Stat. Sol., vol. 176, 1999, pp. 643-648.
Sung, Y., et al., "High Rate Etching of Sapphire Wafer Using Cl2BCl3Ar Inductively Coupled Plasmas", Mat. Sci. & Eng.: Sold State Mat, vol. B82, No. 1-3 2000, pp. 50-52. (Abstract Only).
Wang, X., et al., "Chemical Polishing of Sapphire for Growth of GaN", Chinese Journal of Semiconductors, vol. 18, No. 11, pp. 867-871, 1997. (Abstract Only).
Lee, J., et al., "Scribing and Cutting a Blue LED Wafer Using a Q-Switched Nd:YAG Laser", Applied Physics, vol. 70, No. 5, pp. 561-564, 2000. (Abstract Only).
Kalinski, Z., "Preparation of Sapphire Substrates for Gas Phase GaN Epitaxial Processes", Kristal und Technik, vol. 12, No. 10, pp. 1105-1110, 1977. (Abstract Only).
Jeong, C., et al., "Sapphire Etching with BCl3/HBr/Ar Plasma", Surface & Coatings Technology, vol. 171, No. 1-3, 2003, pp. 280-284. (Abstract Only).
Kalinski, Z., et al., "Structural Etching of Al2O3 Substrate Plates Applied in Gaseous Epitaxy of GaN Layers", Elektronika, vol. 18, No. 3, 1977, pp. 117-119. (Abstract Only).
Lakew, B., et al., "High Tc Superconducting Bolometer on Chemically Etched 7 Micrometer Thick Sapphire", NASA, 1997, 21 pgs. (Abstract Only).
Jeong, C., et al., "Dry Etching of Sapphuire Substrate for Device Separation in Chlorine-Based Inductively Coupled Plasmas", Mat. Sci. & Eng.: Solid State Materials, vol. 93, No. 1-3, pp. 60-63, 2002. (Abstract Only).
Gu, E., et al., "Micromachining and Dicing of Sapphire, Gallium Nitride and Micro LED Devices with UV Copper Vapour Laser", Thin Solid Films, vol. 453-454, pp. 462-466, 2000. (Abstract Only).
Park, H., et al., "A Novel Process for the Generation of Pristine Saphire Surfaces", Thin Solid Films, vol. 422, No. 1-2, pp. 135-140, 2000. (Abstract Only).
Fenner, D., et al., "Ion Beam Nanosmoothing of Sapphire and Silicon Carbide Surfaces", SPIE, vol. 4468, pp. 17-24, 2001. (Abstract Only).
Blecha, Z., et al., "On Fabrication of Sapphire Substrates (1102) for Epitaxy of Monocrystalline Silicon", Jemna Mechanika A Optika, vol. 28, No. 12, pp. 249-351, 1983. (Abstract Only).
Duffy, M., et al., "Optical Characterization of Silicon and Sapphire Surfaces as related to SOS Discrete Device Performance", Journal of Crystal Growth, vol. 58, No. 1, pp. 19-36, 1982 (Abstract Only).
Ehman, M., et al., "Mechanical Preparation of Sapphire Single-Crystal Surfaces by Vibratory Techniques", Metallography, vol. 9, No. 4, pp. 333-339, 1976. (Abstract Only).
Druminiski, M., et al., "Deposition of Epitaxial Films on Spinel and Sapphire. Influence of Substrate Preparation", SIEMENS Forschungs—und Entwicklungsberichte, vol. 5, No. 3, pp. 139-145, 1976. (Abstract Only).
Cullen, G., "The Preparation and Properties of Chemically Vapor Deposited Silicon on Sapphire and Spinel", Journal of Crystal Growth, vol. 9, pp. 107-125, 1971. (Abstract Only).
Liu, L., et al., "Substrates for Gallium Nitride Epitaxy", Mat. Sci. & Eng. Reports, vol. R37, No. 3, pp. 61-127, 2000. (Abstract Only).
Author Unknown, "Specifications for Polished Monocrystalline Sapphire Substrates" 1996, Affiliation (Issuing Organization) SEMI Semiconductor Equipment & Materials Internationa.
Search Report for Technical Articles (Including various Abstract of certain Identified References).
Nakamura, S., et al., "Current Status and Future Prospects of InGaN-Based Laser Diodes," ISAP International, vol. 1, pp. 5-17, 2000.
Khan, M. A., et al., "UV, Blue and Green Light Emitting Diodes Based on GaN-InGaN Multiple Quantum Wells Over Sapphire and (111) Spinel Substrates," Mat. Sci. & Eng., vol. B43, pp. 265-268, 1997.
Nakamura, S., et al., "InGaN Multi-Quantum-Well Structure Laser Diodes Grown on MgAl2O4 Substrates," Applied Physics Letters, vol. 68 (15), pp. 2105-2107 (1996).
S. M. Sze; "VLSI Technology" McGraw-Hill Book Company; Copyright 1983 by Bell Telephone Laboratories, Incorporated; ISBN 0-07-062686-3; pp. 32-42.

* cited by examiner

SPINEL WAFERS AND METHODS OF PREPARATION

CROSS-REFERENCE TO RELATED APPLICATION(S)

The present application is a continuation application of U.S. application Ser. No. 11/065,397, filed Feb. 24, 2005, which application is incorporated by reference herein in its entirety.

BACKGROUND OF THE INVENTION

1. Field of Invention

The invention relates to wafers and methods of preparation thereof and, in particular, to wafers comprising spinel crystal and having low warp and bow characteristics.

2. Discussion of Related Art

Optoelectronic devices can be fabricated by depositing semiconductor material on substrates or wafers. Preferably, these substrates have a compatible crystal structure that promotes growth of the deposited semiconductor into a desirable, as-deposited lattice structure. Substrates which can be utilized can be comprised of sapphire or spinel. To provide desirable optoelectronic device performance, the surface quality of these substrates has been studied and improved.

For example, Robinson et al., in U.S. Pat. No. 3,808,065, disclose a method of polishing sapphire and spinel. Spinel wafers are polished by immersing the wafers in a melt of borax at a temperature of 1000° C. to 1200° C.

Berkenbilt et al., in U.S. Pat. No. 3,964,942, disclose polishing single crystal dielectrics, such as sapphire and magnesium spinel. Polishing involves immersion in a mixture of sulphuric and phosphoric acid at a temperature of 200° C. to 325° C.

Laconto, Sr. et al., in U.S. Pat. No. 5,989,301, disclose optical polishing formulations.

Garg et al., in U.S. Pat. Nos. 6,238,450, 6,258,137, and 6,364,920, disclose ceria powders, CMP products, and CMP formulations.

Robinson et al., in "The Chemical Polishing of Sapphire and Spinel," RCA Rev., vol. 34, pp. 616-629, December 1973, disclose etching of as-sawed, rough-lapped sapphire substrate wafers in a $Al_2O_3$/borax melt.

Yanina and Carter, in "Moving Steps and Crystal Defect on Spinel Surfaces," Mat. Res. Soc. Symp., vol. 620, pp M9.4.1-6, 2000, disclose the morphology of reconstructed $MgAl_2O_4$ spinel and heat treated polished $MgAl_2O_4$ spinel at a temperature of 1200° C. to 1600° C.

Wang, in "Growth and Characterization of Spinel Single Crystals for Substrate Use in Integrated Electronics," J. Appl. Phys., vol. 40, no. 9, pp. 3433-3444, August 1969, disclose spinel wafers prepared by mechanical lapping and hydrogen annealing or etching by $H_2SO_4$, $H_3PO_4$, KOH, $B_2O_3$, $V_2O_5$, $Na_2B_4O_7$, and $PbF_2$.

Aeschlimann et al., in "The Chemical Polishing of Magnesium Aluminate Spinel in Phosphoric Acid," Mat. Res. Bull., vol. 5, pp. 167-172, 1970, disclose chemically polishing spinel in phosphoric acid at 390° C. in twenty minutes and note that polishing times greater than thirty minutes results in lost surface flatness.

Dwilcusuma et al., in "Study on Sapphire Surface Preparation for III-Nitride Heteroepitaxial Growth by Chemical Treatments," J. of Electrochem. Soc., vol. 149, issue 11, pp. G603-G608, November 2002, disclose etching sapphire substrates using sulfuric acid, phosphoric acid, and a mixture of sulfuric and phosphoric acids at a temperature of 100° C. to 300° C.

Korube et al., in "Magnetic Field-Assisted Lapping," Bull. Japan Soc. Of Prec. Engg., vol. 20, no. 1, pp. 49-51 March 1986, disclose a lapping method utilizing a magnetic fluid.

Reisman et al, in "The Chemical Polishing of Sapphire and MgAl Spinel," J. Electrochem Soc., vol. 118, no. 10, pp. 1653-1657 October 1971, disclose air annealing studies of sapphire and spinel.

SUMMARY OF THE INVENTION

In accordance with one or more embodiments, the invention can provide a spinel wafer comprising a non-annealed surface that is substantially free of a defect zone.

In accordance with one or more embodiments, the invention can provide a wafer consisting essentially of single crystal non-stoichiometric spinel and having a surface that is substantially free of a defect zone.

In accordance with one or more embodiments, the invention can provide a method of fabricating a spinel wafer. The method can comprise cutting a spinel boule to produce a wafer, etching the wafer in an etching solution, and chemically mechanically polishing the etched wafer.

In accordance with one or more embodiments, the invention can provide a method of preparing a spinel wafer comprising polishing a surface of the spinel wafer with a slurry comprising $\alpha$-$Al_2O_3$ and a complexing agent, the slurry having a pH of less than about 4.

In accordance with one or more embodiments, the invention can provide a CMP slurry comprising $\alpha$-$Al_2O_3$ particles and a complexing agent wherein the slurry has a pH of less than about 4.

In accordance with one or more embodiments, the invention can provide a spinel wafer having a taper of less than about 3.4 µm and a total indicated reading of less than about 8.2 µm.

BRIEF DESCRIPTION OF THE DRAWINGS

The accompanying drawings are not intended to be drawn to scale. In the drawings, each identical or nearly identical component that is illustrated is represented by a like numeral. For purposes of clarity, not every component may be labeled in every drawing. In the drawings.

DETAILED DESCRIPTION OF THE INVENTION

This invention is not limited in its application to the details of construction and the arrangement of components, systems, or subsystems set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

As used herein, total thickness variation (ITV) refers to the distance between the highest and lowest point on a top surface of a wafer. Total indicated reading (TIR) refers to the distance between a highest and a lowest point on a wafer surface measured normal to a selected focal plane. Warp relates to the distance between a highest and lowest point on a wafer surface measured normal to a selected focal plane in the free state. Bow refers to the distance between a selected focal plane and a surface of a wafer at its center, in the free state. Taper refers to the lack of parallelism between a back surface of a wafer and a selected focal plane, e.g., a best fit plane. Taper is the amount of rise in the focal plane, not the slope of the surface.

In accordance with one or more embodiments, the invention can be characterized as being directed to a wafer or substrate, preferably suitable for deposition of semiconductor materials on a surface thereof, and typically having improved surface qualities relative to, for example, sapphire wafers intended to be used for semiconductor material deposition operations. For example, in accordance with one or more embodiments of the invention, the wafer can have a TIR of less than about 20 μm and, typically, less than about 14 μm, in some cases, less than about 10 μm, and in still other cases, less than and/or about 8.2 μm. In accordance with further embodiments, the invention can be characterized as being directed to a wafer having a TTV of less than about 20 μm and, typically, less than about 16 μm, in some cases, less than about 10 μm, and in still other cases, less than about 5 μm. In accordance with still further embodiments, the invention can be characterized as being directed to a wafer having a taper of less than about 20 μm and, typically, less than about 14 μm, in some cases, less than about 10 μm, in still other cases, less than about 5 μm, and in yet other cases, less than and/or about 3.4 μm. In accordance with other embodiments, the invention can be characterized as being directed to a wafer having a bow and/or warp of less than about 20 μm and, typically, less than about 14 μm, in some cases, less than about 10 μm, in other cases, less than about 5 μm, and in still further cases, less than and/or about 2.8 μm. The invention can be further characterized as being directed to a wafer with at least one surface having a roughness (Rms) of less than about 5 Å (0.5 nm) and, typically, less than about 3 Å.

One or more wafers of the invention can be characterized as having a non-annealed surface that is substantially free of a defect zone. The wafer can be further characterized as comprising or being fabricated from spinel, a single crystal spinel, stoichiometric spinel, non-stoichiometric spinel, and/or, in some cases, consisting essentially of single crystal, non-stoichiometric spinel Spinel can be a magnesium-aluminum oxide ($MgO \cdot Al_2O_3$) crystal, which can be stoichiometric or non-stoichiometric. Stoichiometric spinel typically has an $MgO$ to $Al_2O_3$ ratio of 1:1; non-stoichiometric spinel typically has an $MgO:Al_2O_3$ ratio that is not 1:1. Non-stoichiometric; $Al_2O_3$-rich spinel crystals, preferably as a single crystal, can be utilized in the articles, systems, and techniques of the invention. The $MgO:Al_2O_3$ ratio of the non-stoichiometric spinel of the invention can be between about 1:1.2 to 1:4. Preferably, the content of $Al_2O_3$ relative to $MgO$ is not less than about 2:1, or, in some cases, not less than about 2.5:1. In accordance with other embodiments of the invention, the $Al_2O_3$ content relative to the $MgO$ content can be between about 2.5:1 and about 3:1. For example, the $MgO:Al_2O_3$ ratio can be about 1:2.7 or about 1:2.9. It is believed that stoichiometric and non-stoichiometric spinel can be utilized in the articles, systems, and techniques of the invention. Although $MgO:Al_2O_3$ spinel are described herein, it is believed that other types of spinel crystals may be utilized according to the systems and techniques of the invention.

In accordance with one or more embodiments, the invention can be characterized as providing systems and techniques of fabricating a wafer suitable for deposition of semiconductor materials utilizable as, for example, optoelectronic devices, having superior or at least improved optoelectronic performance as a result of, it is believed, improved wafer substrate surface qualities.

The systems and techniques of the invention can comprise etching a rough-cut wafer prior to performing any chemical mechanical polishing operations to advantageously reduce a defect density in a defect zone and thereby reduce any stress that may be residually present, even after polishing operations. The invention can further be characterized as providing a wafer fabricated with or without an annealing step. The systems and techniques of the invention can further be characterized as removing discontinuous crystal layers from a wafer rather than promoting realignment of irregular crystal structure. However, in still other cases, the invention can be characterized as utilizing an etching step and an annealing step to provide a wafer having surface qualities that are superior, or at least equal, to the surface qualities of commercially available wafers comprised of sapphire, stoichiometric spinel, or both. Accordingly, the wafer surface quality can also be improved by providing one or more processes that permit reordering or reorganization of the wafer crystal structure.

Figure 1:
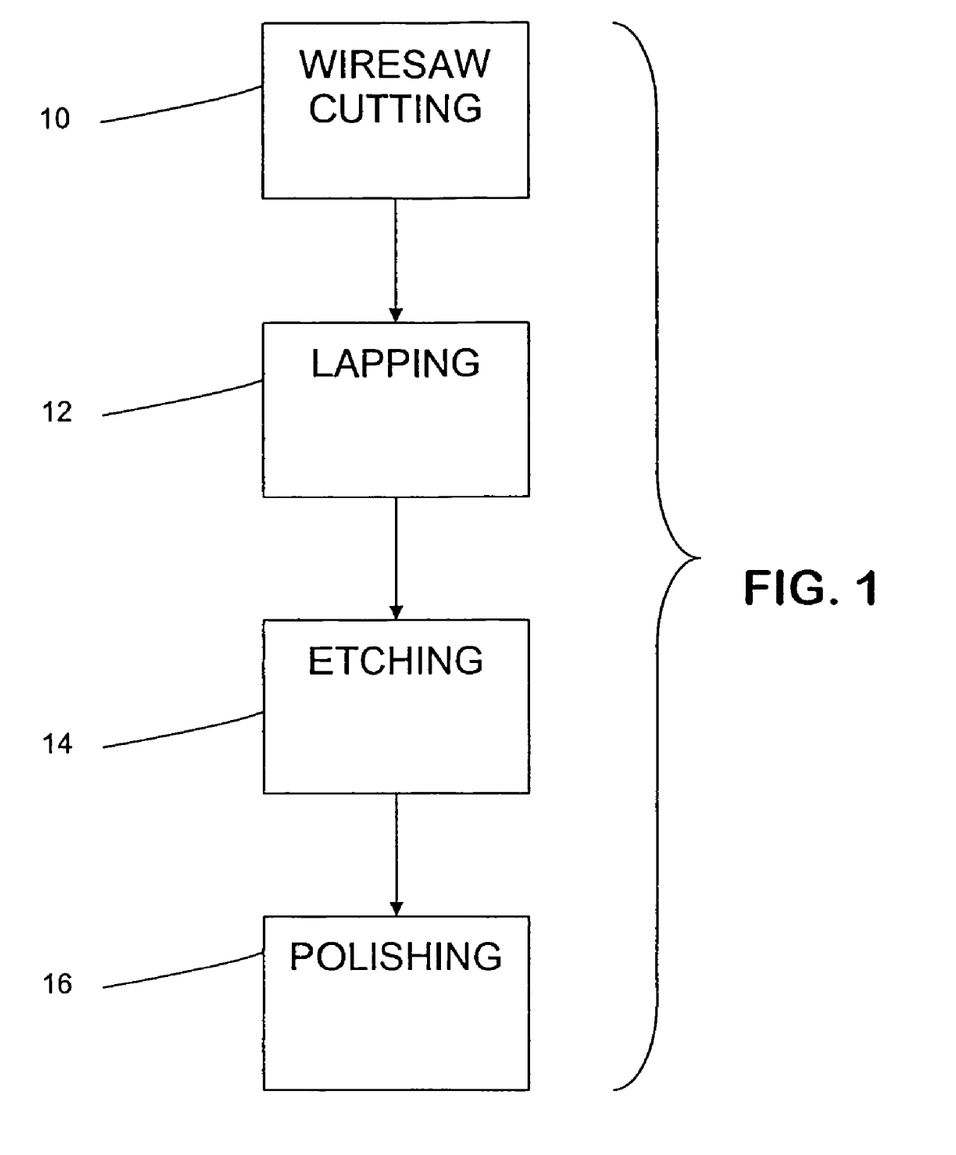
FIG. 1 is a schematic diagram showing spinel wafer fabrication steps in accordance with one or more embodiments of the invention.

As exemplarily shown in FIG. 1, the invention can comprise systems, subsystems, and/or techniques for fabricating a wafer having desirable surface qualities suitable for deposition of semiconductor materials. The systems and techniques can involve one or more acts of providing a boule (not shown), cutting the boule to produce wafers 10, and one or more acts directed to planarizing the wafers until they have suitable, acceptable surface qualities. For example, the acts can comprise cutting a spinel boule, preferably consisting essentially of a single crystal and more preferably consisting essentially of a single crystal non-stoichiometric spinel, to produce rough-cut wafers; optionally, lapping the rough-cut wafers to reduce any cutting-associated surface roughness 12; and chemically etching the rough-cut and/or lapped wafers 14. In some cases, the wafers can be further processed by, for example, chemical mechanical polishing 16 one or both surfaces of the wafers. Optional acts of annealing can be further employed to facilitate processing the wafers.

Cutting 10 can be performed utilizing any system or technique that divides the boule into suitable one or more substrates or wafers. Any suitable cutting tool can be utilized in any one or more of the cutting steps. For example, wiresaw cutting can be performed with one or more wiresaw assemblies or systems utilizing one or more wire bows that divide the boule into one or more rough-cut substrates or wafers. Any suitable wire bow size can be utilized including, for example, a bow of about 1 mm, 2 mm, or even 4 mm. Typically, the wire bow size is selected based on several factors, including, for example, the desired cutting rate, the size of the wafers, and the tolerable roughness resulting from the cutting operation. Other cutting systems and techniques that can be performed in accordance with one or more embodiments of the invention include, for example, ID or OD slicing techniques, as well as apparatus and systems that utilize band and/or wheel cutting techniques. The boule can be cut in one or more cutting steps to produce one or more rough-cut wafers that can have any desired or predetermined target thickness. For example, the thickness of the rough-cut wafer can be less than about 1,000 μm thick.

Optionally, cutting operations can utilize a cutting slurry to facilitate and/or increase the rate of cutting, or improve the resultant surface quality, as evaluated by, for example, roughness. Preferably, the cutting slurry can facilitate an act of cutting and further reduce the overall wafer processing operation by, for example, reducing cutting-associated wafer surface asperities which should reduce the extent or, in some cases, eliminate, downstream processing requirements. The cutting slurry can comprise one or more abrasive materials including, but not limited to, silicon carbide (SiC), diamond, boron carbide ($B_4C$), as well as combinations thereof. Various abrasive material sizes can be utilized to tailor the cutting slurry with the cutting operations as necessary or desired to achieve a target cutting rate and/or surface quality of the rough-cut wafers. For example, the abrasive materials can have particle sizes from about 1 μm to about 35 μm. Further, the amount or loading of one or more abrasive materials in the cutting slurry can also be tailored to achieve desirable rough-cut qualities and/or cutting performance. Thus, in accordance with one or more embodiments, the cutting slurry can have a solids loading, of abrasive material, from about 0.2% to about 25% by weight. The cutting slurry can comprise an aqueous based fluid, e.g. glycol based or water based, to facilitate or serve as a carrier of the one or more abrasive materials and, in some cases, to remove waste from the cutting region and/or maintain or reduce the cutting process temperature. Preferably, the cutting slurry can further comprise one or more additives or processing aids including, but not limited to, rust or corrosion inhibitors as well as anti-foaming agents, preservatives, and/or or stabilizing agents that can also improve cutting operation performance and/or the surface qualities of the rough-cut wafers.

The rough-cut wafers can be further processed by utilizing one or more systems or techniques that reduce the roughness of at least one surface of the wafers; reduce the thickness of the wafers; and, in some cases, reduce or correct any surface asperities and/or fracture damage that are associated with or that can result from the one or more cutting operations. Reducing the surface roughness can be performed in one or more steps that can reduce the number and/or size of undesirable surface features in stages or steps. For example, a first stage can be utilized to reduce relatively larger sized asperities to reduce the magnitude of such asperities that can contribute to the coarseness of the wafer surface and second or subsequent steps further finish the wafer to within target or desirable roughness qualities. In accordance with one or more preferred embodiments, the one or more processing acts can also facilitate the removal of one or more portions or regions of the wafer having high crystal defect density. In further preferred embodiments, one or more processing acts can be utilized to facilitate reordering or reorganization of the wafer crystal to reduce crystal defect density.

For example, the rough-cut wafers can be processed in one or more lapping operations 12. Lapping can be performed on one or both surfaces of the rough-cut wafers. Further, various abrasive materials having any suitable size, composition, shape, and carrier vehicle, can be utilized, typically in a lapping slurry, to facilitate removal or reduction of asperities to provide a high material removal rate and achieve or reduce the surface roughness of the rough-cut wafer, while, preferably, avoiding creation of any scratches and reducing formation of any sub-surface damage as well as reducing the overall lapping time.

Various lapping conditions can be utilized. Thus, the size of the lapping plate, the applied pressure on the wafer, the relative speed or angular velocity of the lapping plate, the abrasive material, or solids loading in the lapping slurry can be adjusted as needed to achieve the desired wafer surface properties or target processing requirements. For example, the applied pressure can range from about 0.01 MPa (1.45 psi) to about 0.1 MPa (14.5 psi); the relative surface velocity can vary from about 0.1 $msec^{-1}$ to about 2 $msec^{-1}$; the lapping slurry flow rate can vary from about 1 ml/min to about 100 ml/min; the abrasive grain loading can vary from about 0.2% to about 50%; the abrasive material can include $B_4C$, SiC, alumina ($Al_2O_3$), aluminum-magnesium spinel ($MgAl_2O_4$), and diamond, as well as combinations or mixtures thereof.

In accordance with further embodiments of the invention, the selection of the composition or type of lapping slurry can be based on target or desired criteria including, for example, the surface thickness removal rate and the final or intermediate roughness (typically measured as Ra in μm). For example, the choice of lapping slurry can depend on one or more factors including the removal rate and/or the desired lapped surface roughness.

The lapping slurry can be prepared by any suitable technique that results in a desired lapping performance. For example, an about 20% solids loaded slurry can be prepared by mixing about 320 grams of an abrasive grain with about 600 grams of deionized water. About 56 grams of HTS-1.4 lapping vehicle, available from Intersurface Dynamics Inc., Bethel, Conn., can be mixed with about 200 grams of deionized water to obtain a uniform mixture. The two mixtures can then be mixed together along with about 426 grams of deionized water.

In accordance with one or more embodiments, the invention can utilize systems and techniques that can polish 16 one or more surfaces of the wafer to achieve a target surface quality.

The wafer can be further polished utilizing chemical mechanical polishing systems and techniques. CMP can be performed utilizing one or more slurry compositions to achieve one or more target surface properties. The systems and techniques of the invention can utilize a CMP slurry, which typically comprises an aqueous carrier, comprising one or more abrasive materials and, in some cases, one or more complexing agents that improves the polishing rate and/or material removal rate; prevents or inhibits agglomeration of components, such the abrasive material or removed crystal material in the CMP slurry; and/or facilitates polishing a surface of the wafer. In accordance with one or more preferred embodiments of the invention, the addition of the complexing agent increases the material removal rate without affecting the quality of surface finish, e.g., surface roughness. The CMP slurry can further comprise one or more pH controlling or contributing species.

Preferably, the abrasive material of the CMP slurry can comprise a material that does not agglomerate at polishing conditions or at least reduces any tendency to agglomerate at polishing conditions. The abrasive material can be characterized as being isoelectrically stable at CMP operation conditions.

The CMP slurry is typically stable at a pH of less than about 5, or even a pH of less than about 4.5, in some cases, at a pH of between 2 and about 4 and, in still other cases, at a pH of about 3.8. The pH controlling or contributing species can comprise one or more acids, which can be inorganic or organic. For example, the acid of the CMP slurry can comprise any one or more of nitric acid, hydrochloric acid, sulfuric acid, and citric acid. The pH controlling or contributing species can further include one or more components that can raise pH including, for example, inorganic or organic bases such as, but not limited to NaOH, $NH_3OH$, and KOH.

The abrasive material can include, for example, $\alpha\text{-}Al_2O_3$, $\gamma\text{-}Al_2O_3$, $CeO_2$, $ZrO_2$, $SiO_2$ as well as combinations thereof. The abrasive material can have a loading in the slurry from about 0.2% to about 40% by weight.

The complexing agent can comprise one or more organic phosphate compounds such as, but not limited to organic phosphonates. Examples of organic phosphate compounds that can be utilized in accordance with one or more systems and techniques of the invention include, but are not limited to, those available as MAYOQUEST® 1320 nitrilotrimethylenephosphonic acid or aminotri(methylenephosphonic acid), MAYOQUEST® 2100 2-phosphonobutane-1,2,4-tricarboxylic acid, or PBTC, which are available from Callaway Chemical Company, Mayo Division, Smyrna, Ga. Other compounds that can be utilized include sequestering agents that tend to form a complex which remains in solution even in the presence of one or more precipitating agents. Such compounds preferably control the activity of metal ions by, it is believed, inactivating the reactive sites of the metals ions to reduce metal ion activity and prevent chemical reactions. For example, one or more of ethylenediaminetetraacetic acid or EDTA, nitrilotriacetic acid or NTA, gluconates, glucoheptonates and polyacrylates can be utilized as the complexing agent.

The slurry can be prepared to have a desired solids loading by diluting with deionized water. The pH of the slurry can then be adjusted to the desired range by adding one or more acids and/or one or more bases such as sodium hydroxide, potassium hydroxide, or a mixture thereof. The concentration of the complexing agent can vary as appropriate to achieve a suitable, desired performance. For example, the concentration of MAYOQUEST® 2100 can be about 0.36 wt % to obtain a target MRR and roughness.

CMP operating parameters can also be tailored to achieve or at least serve to facilitate satisfying the target surface quality requirements. For example, CMP operations can be performed utilizing an applied wafer surface pressure of between about 0.007 MPa (1 psi) to about 0.07 Mpa (10 psi) and a relative velocity in a range of about 0.1 m/s about 5 m/s.

In accordance with one or more embodiments of the invention, wafers can also be prepared by chemically etching 14 the cut and/or lapped substrates in one or more etching solutions to remove a plastic, defect zone from one or more surfaces thereof. In some cases, the invention can be further characterized as reducing the concentration of deformations such as those associated with crystal lattice mismatches and/or removing at least a portion of a zone having a relatively high density of stress, typically as residual or mechanical stress.

The invention can also be characterized as utilizing one or more stress reducing or relaxation systems or techniques. As exemplarily shown in the schematic diagram of FIG. 2, the rough-cut wafer and/or the lapped wafer can include a high stress density or defect zone 20, typically near the wafer surface that can be created or developed when an abrasive material 30 is utilized to remove a portion of the surface of wafer to during, for example, cutting, lapping, and/or polishing operations. Defect zone is a region or portion of a substrate or wafer having a high defect density relative to, for example, the bulk of the substrate or wafer. The defect zone is typically a region adjacent to, and can include, a surface of the wafer. Thus, removing a defect zone can comprise rendering substantially all of the substrate or wafer as having the same relative defect density.

Figure 2:
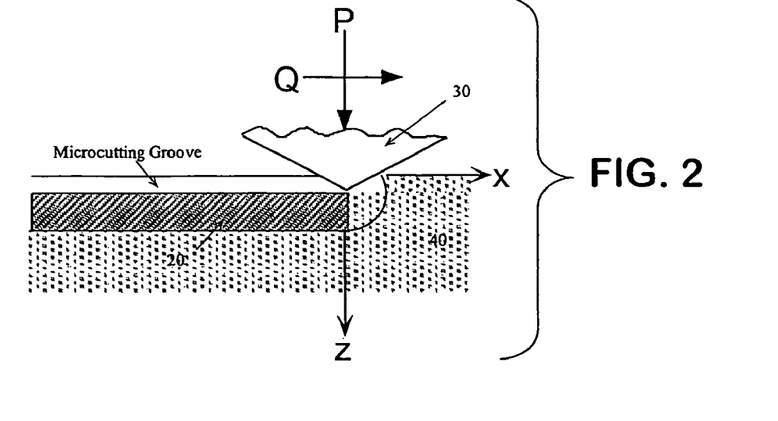
FIG. 2 is a schematic diagram depicting typical defect damage (plastic zone or defect zone) on a surface of a spinel wafer.

The invention can be characterized as removing at least a portion of high stress density layer or defect zone 20, which can be about 0.5 μm to as much as 5 μm deep from the surface. The high stress density layer or high defect density zone is typically a region adjacent to or including the surface of a wafer that is characterized by high crystal lattice defects that can result in irregular crystal ordering and are typically regions with high local stress. High defect density is typically characterized relative to the bulk of the substrate or wafer such that a high defect density region or zone can have defects per unit volume greater than about 50% of the defects in the bulk material. However, in some cases, e.g. dependent upon the ultimate use or service of the wafer, a high defect density may be characterized as having defects per unit volume greater than about 10%, greater than about 20%, greater than about 30%, or even greater than about 40%. The extent or magnitude of the defect density or stress level can be quantified by characterizing the nature of the crystal lattice utilizing, for example, x-ray diffraction techniques. Thus, in accordance with one or more embodiments, the invention utilizes one or more systems and techniques that can remove or at least reduce the depth of a high stress density layer. For example, the systems and techniques of the invention can remove or at least reduce the thickness of wafer by at least about 0.5 μm to as much as 5 μm, preferably about 2 μm to about 3 μm, from at least one surface of the wafer.

Removal of the defect zone can be performed before lapping, after lapping, and, in some cases, after CMP operations. Removal of the defect zone can be effected by, for example, etching the wafer in one or more etching solutions that dissolves, preferably at a controlled, uniform rate, at least a portion, preferably all of any defect zone that may be present on a surface of the wafer. Examples of etching solutions that can be suitably utilized to remove at least a portion of the defect zone include acidic solutions and basic solutions. The acidic solutions can comprise one or more inorganic acids and, in some cases, one or more organic acids. Examples of inorganic acids that can be utilized in the etching solutions of the invention include nitric acid, sulfuric acid, hydrochloric acid, and phosphoric acid. In some cases, the one or more etching solutions can comprise a mixture of sulfuric acid and phosphoric acid. The relative concentration of the sulfuric acid to phosphoric acid can vary from about 1:99 to about 99:1, by volume. In some cases, the relative sulfuric to phosphoric acid ratio can be particularly effective at a range from about 1:9 to about 9:1, from about 1:5 to about 5:1, or even at about 1:3 to about 3:1.

The invention can be further characterized as providing stress relaxation, which can be performed under conditions that provide suitable material removal rate and, preferably, produce a desired final or finished wafer quality. Etching can be chemically performed at a temperature that provides an acceptable material removal rate to achieve one or more, preferably, all, desired wafer surface properties within a target period. For example, etching can be performed utilizing an etching solution having a temperature of at least about 50° C., typically at least at about 100° C., and in some cases, at least about 150° C. Preferably, etching is performed by immersing at least a portion of the wafer in an etching solution having a temperature maintained at about 175° C. However, etching may be performed with an etching solution at any suitable temperature that can effect the desired material removal results.

The wafer can be immersed in the etching solution for a duration sufficient to remove at least a portion of the defect zone. Thus, for example, the wafer can be immersed in an etching solution for at least about ten minutes; in some cases, at least about twenty minutes; in other cases, at least about thirty minutes; and in still other cases, at least about one hour. As with the selection of the etching solution temperature, the etching immersion duration can vary as desired to achieve a target etching effect.

The systems and techniques of the invention can further utilize one or more rinsing operations between, as part of, or after any of the cutting, lapping, etching, and polishing operations. Rinsing can be performed utilizing any suitable solution that removes undesirable species from a surface of the wafer. Preferably, rinsing is performed under conditions that reduces or prevents formation of any residual stress while removing the undesirable species. For example, rinsing can be performed to remove any remnant etching solution by utilizing water, such as deionized water, having a temperature that is at about the same temperature of the one or more of the etching solutions.

Two or more successive rinsing steps can be utilized between, as part of, or after any of the cutting, lapping, etching, and polishing operations. Moreover, the rinsing solutions can have lower successive temperatures. For example, a first rinsing solution can have a temperature about equal to or slightly less than the etching solution temperature; a second rinsing solution can have a temperature at least about 25° C. below the first rinsing temperature. For example, the first rinsing solution, after etching, can have a temperature of about 75° C. and the second rinsing solution can be at ambient temperature between about 20° C. to about 25° C.

The systems and techniques of the invention can further include processing acts or steps that facilitate reordering or reorganization of the wafer crystal lattice. In some cases, such techniques can include one or more steps or acts that can also promote at least partial removal of defect-causing impurities. For example, the invention can comprise wafers exposed to one or more solutions or techniques that facilitate migration of an impurity species. The techniques can further facilitate removal by promoting ex-situ, outside of the wafer crystal lattice, precipitation of the one or more impurity species.

Techniques that can promote reordering or reorganization of the crystal lattice and/or promote removal of defect-causing impurities can include, for example, heat treatment and/or annealing. Annealing techniques can be performed under various conditions and one or more annealing steps can be performed before lapping, after lapping, before etching, after etching, before chemical mechanical polishing, and/or after chemical mechanical polishing.

Further, annealing can comprise one or more stages or heat soaking steps at various durations, heating rates, cooling rates, and atmospheres or exposure environments. For example, annealing can be performed by heating to a heat soak temperature of at least about 500° C., about 750° C., about 1000° C. or even at least about 2000° C., for at least one minute, at least about 10 minutes, about hour, about two hours, about six hours, about twelve hours, or even at least about twenty-four hours. Preferably the soaking temperatures are chosen to be below the crystal melting temperature. Thus, in accordance with one or more embodiments, annealing can be performed at about 1000° C. for about twelve minutes. The heating rate to the soaking temperature can be performed, linearly or non-linearly, in any suitable period, such as within one hour, two hours, four hours, six hours, twelve hours, or even twenty-four hours. After one or more soaking steps, the annealing procedure can include cooling the wafer to ambient or room temperature in one or more cooling steps. The cooling rate can be performed, linearly or non-linearly, in any suitable period such as within or no less than one hour, two hours, four hours, six hours, twelve hours, or even twenty-four hours. Any one or more of the annealing steps can be performed utilizing any suitable exposure environment such as air or oxygen or an inert atmosphere such as nitrogen or argon or in vacuum.

Further, the exposure environment conditions can vary for any one or more of the annealing steps. Thus, for example, the one or more exposure environments having one or more gases at one or more exposure pressures can be utilized in any one or more annealing steps or operations. Exposure environments can also utilize static or purging techniques.

EXAMPLES

The functions and advantages of the various embodiments of the invention can be further understood from the examples below. The following examples illustrate the benefits and/or advantages of the systems and techniques of the invention but do not exemplify the full scope of the invention.

Example 1

Wiresaw Cutting

A non-stoichiometric spinel boule, about 2-inch in diameter, was wiresaw cut utilizing various cutting slurries.

Table 1 lists the various cutting slurries utilized along with the resultant cutting time for each.

TABLE 1

| Run | Slurry | Vehicle | Solid Loading, % by volume | Cutting Time, hours | Wire Bow, mm |
| --- | --- | --- | --- | --- | --- |
| 1 | SiC F400, 17 μm | WS749 | 24 | 11 | 4 |
| 2 | Diamond, 15 μm | WS236 | 5 | 14 | 1 |
| 3 | SiC F400, 17 μm | WS236 | 24 | 13 | 1 |
| 4 | SiC P500, 32 μm | WS236 | 24 | 18 | 1 |

F400 and F500 refer to the grain size distribution as characterized in accordance with the Federation of European Producers of Abrasives (FEPA) standards. WS 749 and WS236 are glycol-based vehicles.

Example 2

Lapping

Several wafers were obtained from wiresaw cutting operations as substantially described in Example 1. These non-stoichiometric spinel wafers were lapped utilizing various lapping slurries. Lapping was performed utilizing a model AL00-1 lapping system available from Peter Wolters A G, Rendsburg, Germany. The applied pressure was about 1.5 psi; the relative surface velocity was about 0.8 msec; the slurry flow rate was about 40 ml/min; and about 15% abrasive material grain by weight was utilized in the lapping slurry.

For each wafer, the material removal rate, the initial and final surface roughness (Ra), the maximum peak to valley height (PV), and the average value of the five highest peaks and five lowest valleys (Rz) were measured over the evaluation length. TTV, bow and flatness were also measured.

Figure 3A:
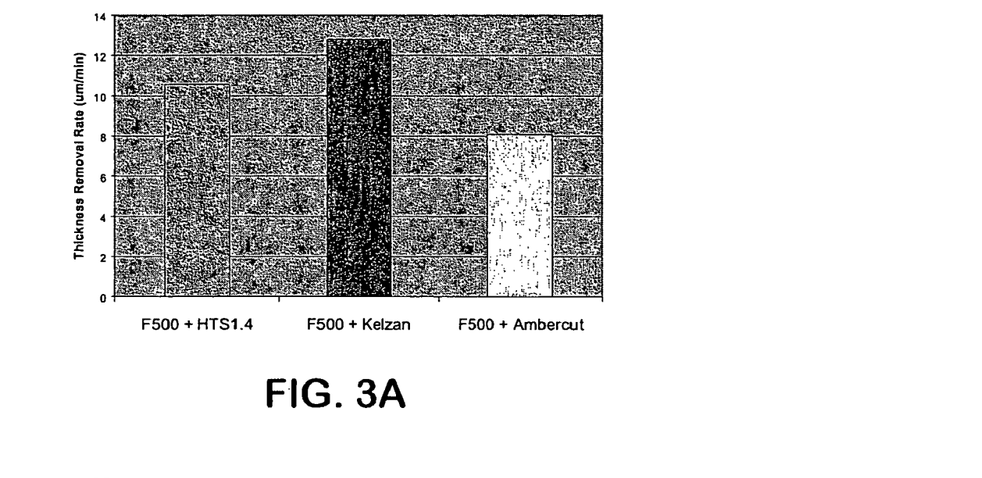
FIGS. 3A-3C are graphs showing the effect on performance of representative lapping vehicles utilized in accordance with one or more embodiments of the invention.
Figure 3B:
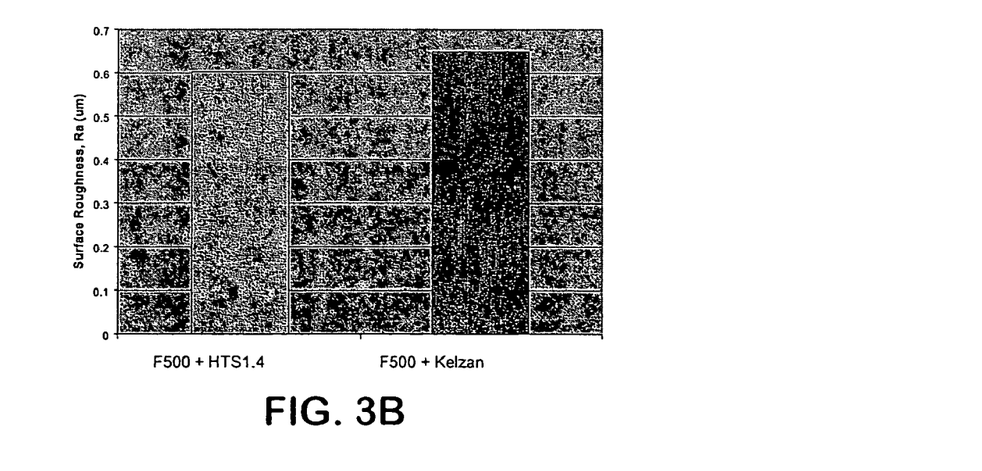
Figure 3C:
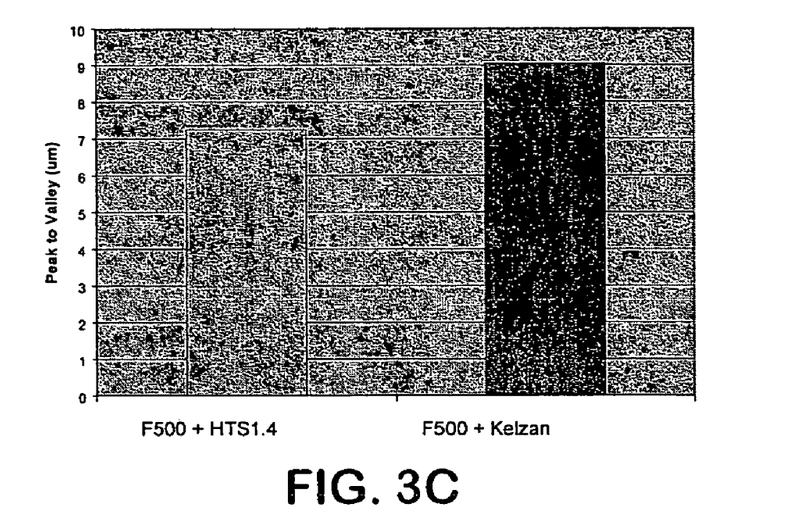

FIGS. 3A-3C show the effect on performance of the various lapping vehicles utilized wherein HTS-1.4, AMBER-CUT, and KELZAN refer to lapping vehicles, some of which are available from, for example, Intersurface Dynamics Inc., Bethel, Conn. and Innovative Organics/Saint-Gobain Corporation, Anaheim, Calif., and F500 refers to the grain size distribution as characterized in accordance with the Federation of European Producers of Abrasives standards.

Example 3

Chemical Etching

Several 2-inch diameter non-stoichiometric spinel wafers, about 360 μm thick, were prepared by wire saw cutting (utilizing a wiresaw from HCT Shaping Systems SA, Switzerland, with a wire diameter of about 180 μm, wire speed of about 10 m/sec, a cutting speed of about 127 μm/sec, a wire forward about 200 μm and a wire backward about 192 μm) a non-stoichiometric spinel boule while utilizing a cutting slurry having about 1400000 carats (about 28 kg) of resin bonded diamond (about 15 μm), about 38 gallons of glycol (WS236), and about 100 ml of an antifoaming agent; lapping as substantially described in Example 2. These lapped wafers were etched in several acid solutions, listed in Table 2.

For each run, the etching solution volume utilized was about 80 ml. The etching solutions utilized about 98% sulfuric acid alone or with phosphoric acid. Each of the etching solutions was heated in a covered alumina crucible on a hotplate to the desired temperature. Each of the wafers was weighed prior to etching.

Four runs, varying time and temperature, were performed. In the pure sulfuric acid experimental runs, wafers were etched at temperatures of about 150° C. and at about 230° C. for about fifteen minutes, at about 175° C. for about ninety minutes, and at about 245° C. for about thirty minutes. In the sulfuric acid and phosphoric acid mixture (3:1 by volume) experimental runs, wafers were etched at about 150° C. for about fifteen and thirty minutes, and at about 240° C. for about thirty minutes.

After immersion in the etching solutions, the wafers were allowed to cool in ambient temperature air, rinsed with boiling water, and, subsequently, with room temperature, deionized water. The wafers were dried with a nitrogen stream and weighed. Table 2 summarizes the etching conditions and the measured etching rates.

TABLE 2

| Description | Etching Solution | Temperature, ° C. | Time, minutes | Total Thickness Removed, μm | Etching Rate, mg/min |
|---|---|---|---|---|---|
| Production Scale (28 wafers/batch) | $H_2SO_4$ | 175 | 90 | 1.628 | 0.133 |
| 1 | $H_2SO_4$ | 50 | 15 | 0.014 | 0.0007 |
| 2 | $H_2SO_4$ | 75 | 15 | 0.041 | 0.02 |
| 3 | $H_2SO_4$ | 100 | 15 | 0.082 | 0.04 |
| 4 | $H_2SO_4$ | 125 | 15 | 0.163 | 0.08 |
| 5 | $H_2SO_4$ | 150 | 15 | 0.136 | 0.067 |
| 6 | $H_2SO_4$ | 230 | 15 | 1.496 | 0.733 |
| 7 | $H_2SO_4$ | 240 | 30 | 2.122 | 0.52 |
| 8 | $H_2SO_4 + H_3PO_4$ (9:1) | 175 | 15 | 0.748 | 0.367 |
| 9 | $H_2SO_4 + H_3PO_4$ (9:1) | 220 | 20 | 3.332 | 1.125 |
| 10 | $H_2SO_4 + H_3PO_4$ (5:1) | 150 | 15 | 0.313 | 0.153 |
| 11 | $H_2SO_4 + H_3PO_4$ (3:1) | 100 | 15 | 0.136 | 0.067 |
| 12 | $H_2SO_4 + H_3PO_4$ (3:1) | 150 | 15 | 0.422 | 0.207 |
| 13 | $H_2SO_4 + H_3PO_4$ (3:1) | 175 | 15 | 0.884 | 0.433 |
| 14 | $H_2SO_4 + H_3PO_4$ (3:1) | 200 | 15 | 2.04 | 1 |
| 15 | $H_2SO_4 + H_3PO_4$ (3:1) | 240 | 30 | 10.839 | 2.657 |
| 16 | $H_2SO_4 + H_3PO_4$ (1:1) | 230 | 15 | 4.719 | 2.313 |
| 17 | $H_2SO_4 + H_3PO_4$ (1:1) | 250 | 15 | 6.623 | 3.247 |
| 18 | $H_2SO_4 + H_3PO_4$ (1:1) | 175, increased to 210 in the last 5 minutes | 15 | 3.699 | 1.813 |

Example 4

Chemical Mechanical Polishing

Chemical mechanical polishing operations were performed on 2-inch spinel wafer samples that were chemically etched as substantially described in Example 3. Etching was performed by immersing the wafers in sulfuric acid at about 175° C. for about ninety minutes.

Figure 4:
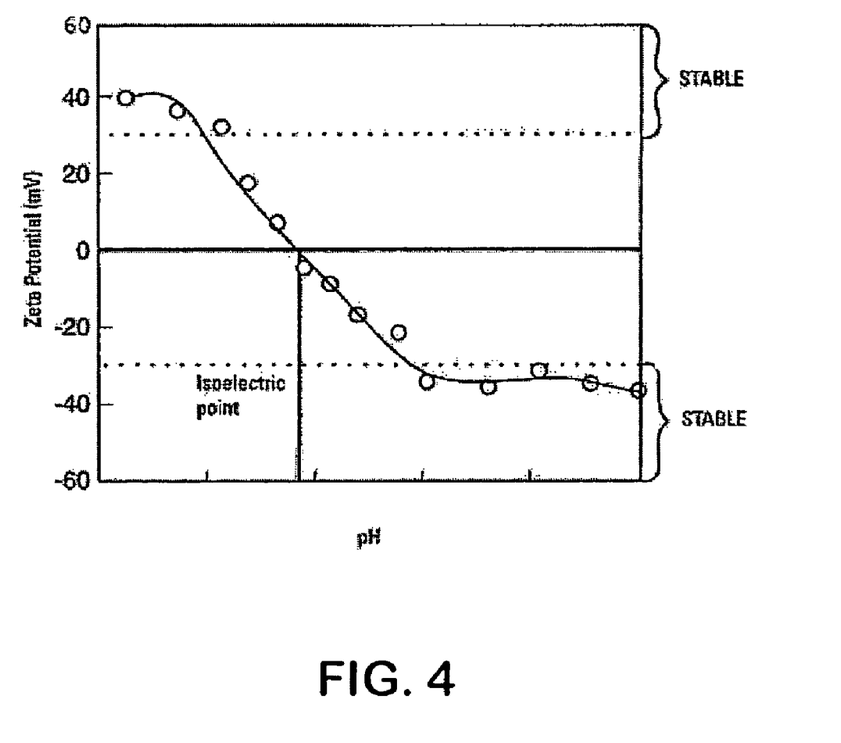
FIG. 4 is a graph showing typical isoelectric behavior in terms of zeta potential of particles in a chemical mechanical planarization or polishing (CMP) slurry in accordance with one or more embodiments of the invention.

FIG. 4 exemplarily shows the typical isoelectric behavior in terms of zeta potential of particles in a CMP slurry. As shown, the particles are typically stable at a pH of less than about 4 and may also be stable at relatively high pH.

Figure 5A:
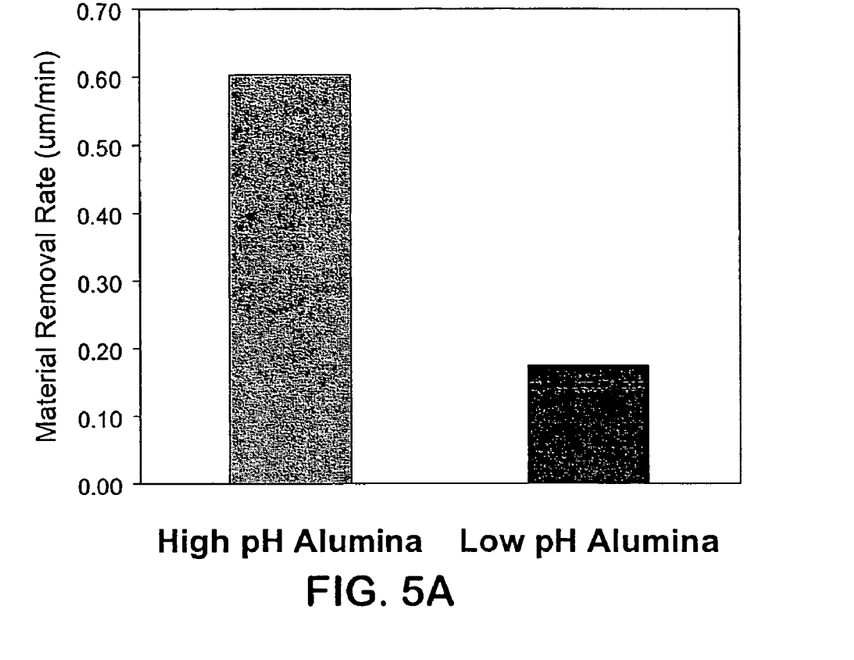
FIGS. 5A-5B are graphs showing the performance, quantified as material removal rate (MRR) and surface finish, of $\alpha$-$Al_2O_3$ abrasive materials at low and high pH conditions in a CMP slurry when utilized to polish spinel wafers in accordance with one or more embodiments of the invention.
Figure 5B:
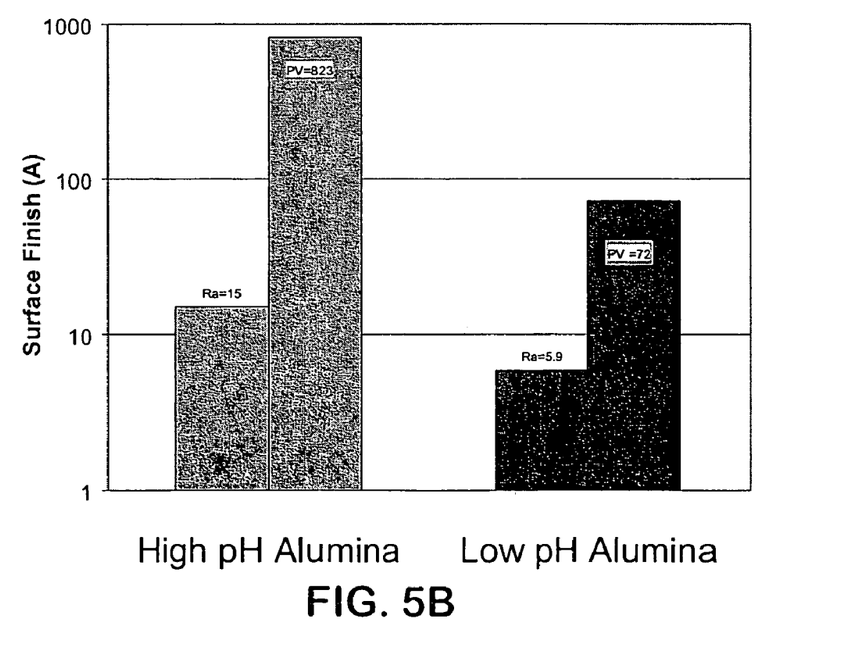
Figure 6A:
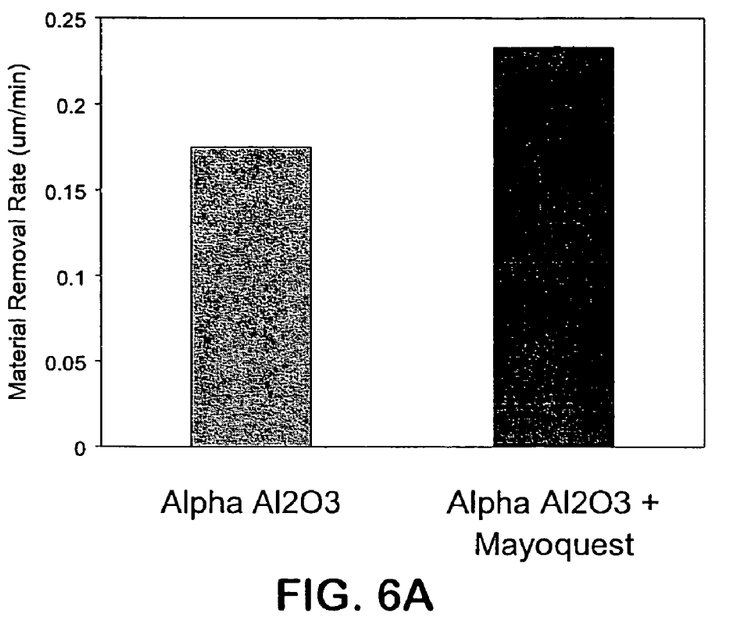
FIGS. 6A-6B are graphs showing the performance, quantified as MRR and surface finish, of $\alpha$-$Al_2O_3$ abrasive materials with and without a complexing agent in a CMP slurry in accordance with one or more embodiments of the invention.
Figure 6B:
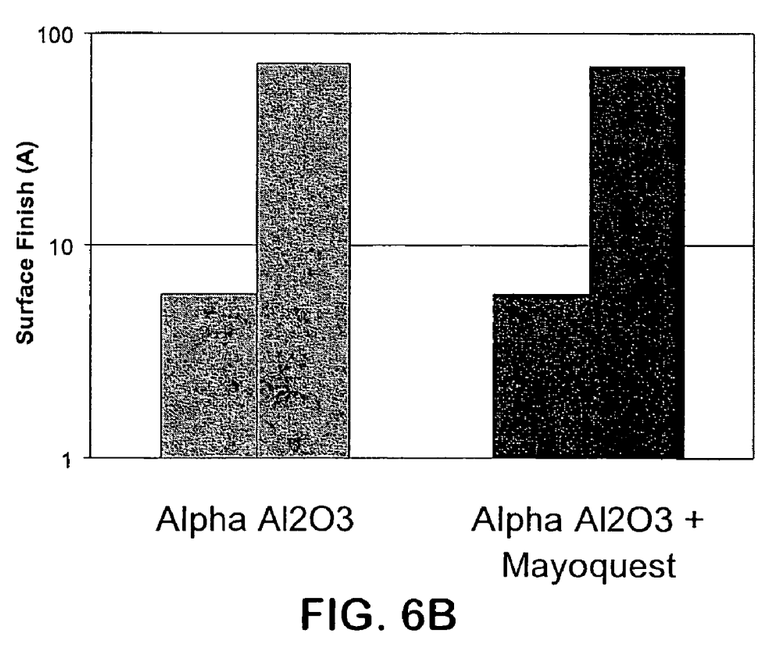

FIGS. 5A-5B graphically illustrate the performance, quantified as MRR and surface finish, of silica and alpha alumina abrasive materials in the CMP slurry when utilized to polish wafers; the results show that low pH alpha alumina has an acceptable MRR while providing acceptable surface finish qualities. FIGS. 6A-6B graphically illustrates the effect on performance with the use of an organic phosphate additive in the CMP slurry. In FIG. 6B, the smaller bar (lower surface roughness value) was the measured Ra and the taller bar (higher value) was the measured PV. The data shows that the same surface finish quality was achieved by utilizing a complexing agent.

Tables 3 and 4 list the performance of various CMP slurries, without (Table 3) and with a complexing agent (Table 4). CMP was performed with an applied pressure of about 4 psi; a relative velocity of about 3 msec; a slurry solids loading of about 10% by volume; and for a polishing time of about two hours. The pH of the CMP slurries were about 3.8. The data in Tables 3 and 4 shows that utilizing a complexing agent in low pH α-$Al_2O_3$ CMP slurry can increase the MRR without substantially changing the surface finish properties.

TABLE 3

Low pH α-$Al_2O_3$ CMP slurry performance (10% solids) without a complexing agent.

| Time, minutes | Amount Removed, μm | Ra, μm | PV, μm | Rz, μm | Rms, μm |
|---|---|---|---|---|---|
| 0 | — | | | | |
| 60 | 12.1 | | | | |
| 120 | 21.5 | | | | |
| 180 | 32.6 | | | | |
| 210 | 38.1 | 5.9 | 72 | 52 | 7.4 |
| 0 | — | | | | |
| 60 | 10.5 | | | | |
| 120 | 19.0 | | | | |
| 180 | 31.2 | | | | |
| 210 | 36.3 | 5.2 | 58 | 42 | 6.6 |

TABLE 4

Low pH α-$Al_2O_3$ CMP slurry performance (10% solids) with MAYOQUEST® 2100 PBTC as a complexing agent.

| Time, minutes | Amount Removed, μm | Ra, μm | PV, μm | Rz, μm | Rms, μm |
|---|---|---|---|---|---|
| 0 | — | | | | |
| 60 | 13.6 | | | | |
| 120 | 25.8 | | | | |
| 180 | 41.4 | | | | |
| 210 | 49.6 | 5.6 | 73 | 50 | 7.1 |
| 0 | — | | | | |
| 60 | 14.8 | | | | |
| 120 | 27.8 | | | | |
| 180 | 42.3 | 5.9 | 71 | 48 | 7.4 |

Example 5

Fabricated Wafer

Wafers were prepared by wiresaw cutting a non-stoichiometric spinel boule (MgO:$Al_2O_3$ ratio of about 1:3) as substantially described in Example 1. The rough-cut wafers were then lapped as substantially described in Example 2. Some of the lapped, rough-cut wafers were then etched as substantially described in Example 3. Finally, the etched wafers were chemically mechanically polished as substantially described in Example 4.

Etched and non-etched wafers were evaluated and determined to have the properties listed in Table 5; 26 wafers were etched and 26 wafers were not and the average of the measured values are listed along with the standard deviation in parenthesis.

Figure 7:
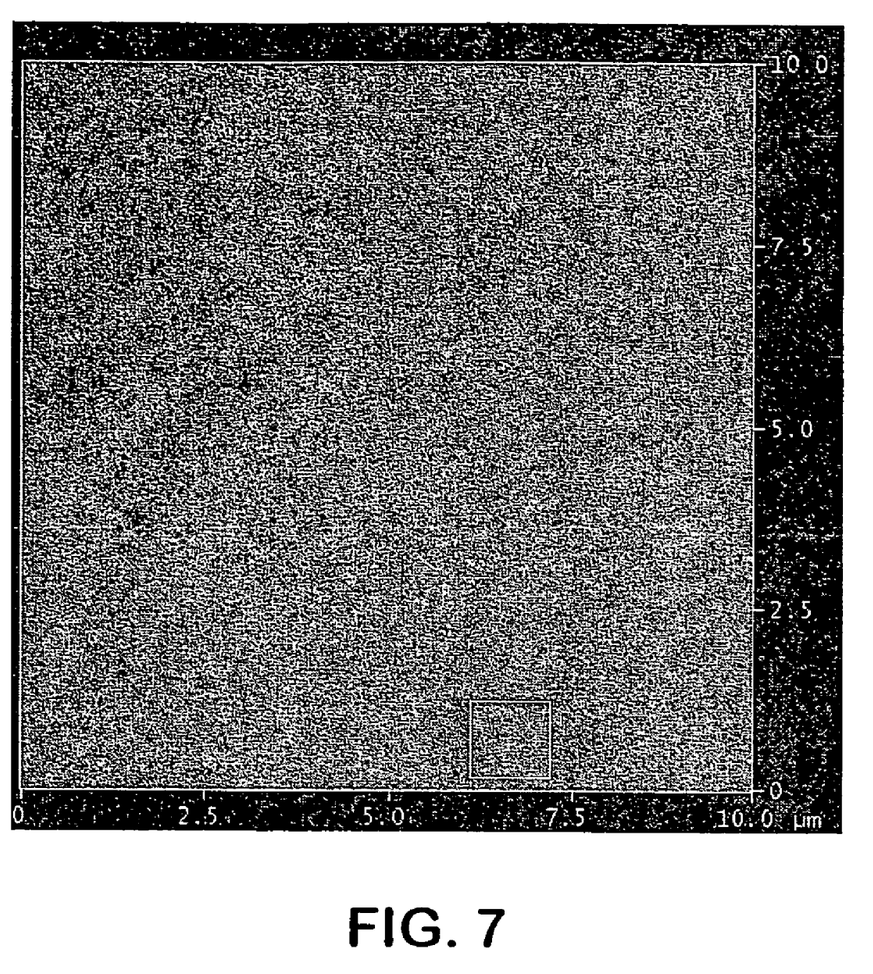
FIG. 7 is a copy of an AFM photograph of a spinel wafer fabricated in accordance with one or more embodiments of the invention.

FIG. 7, which is a copy of an AFM photograph, shows the surface quality of the fabricated wafer; the wafer shown was found to have no visible scratches or pits with a Rms of about 0.224 nm, a Ra of about 0.176 nm and a Rmax of about 5.634 nm. The boxed region shown in FIG. 7 was measured to have a Rms of about 0.205 nm, a Ra of about 0.158 nm, and a Rmax of about 3.232 nm.

Figure 8:
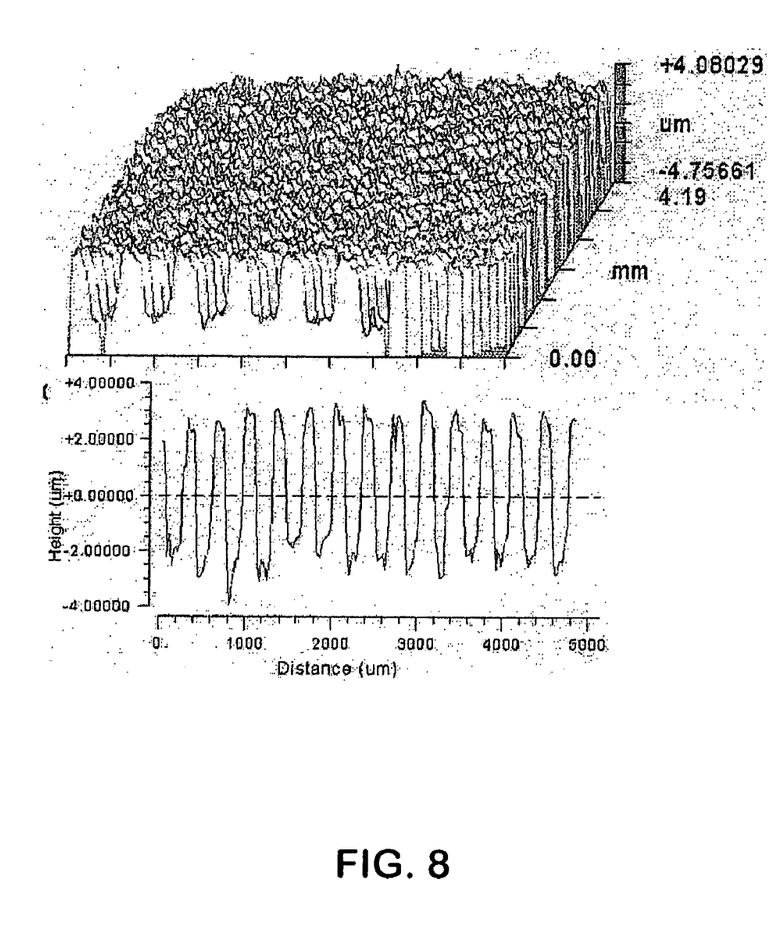
FIG. 8 is a copy of a screen display characterizing the roughness of a portion of a surface of a rough-cut spinel wafer in accordance with one or more embodiments of the invention.
Figure 9:
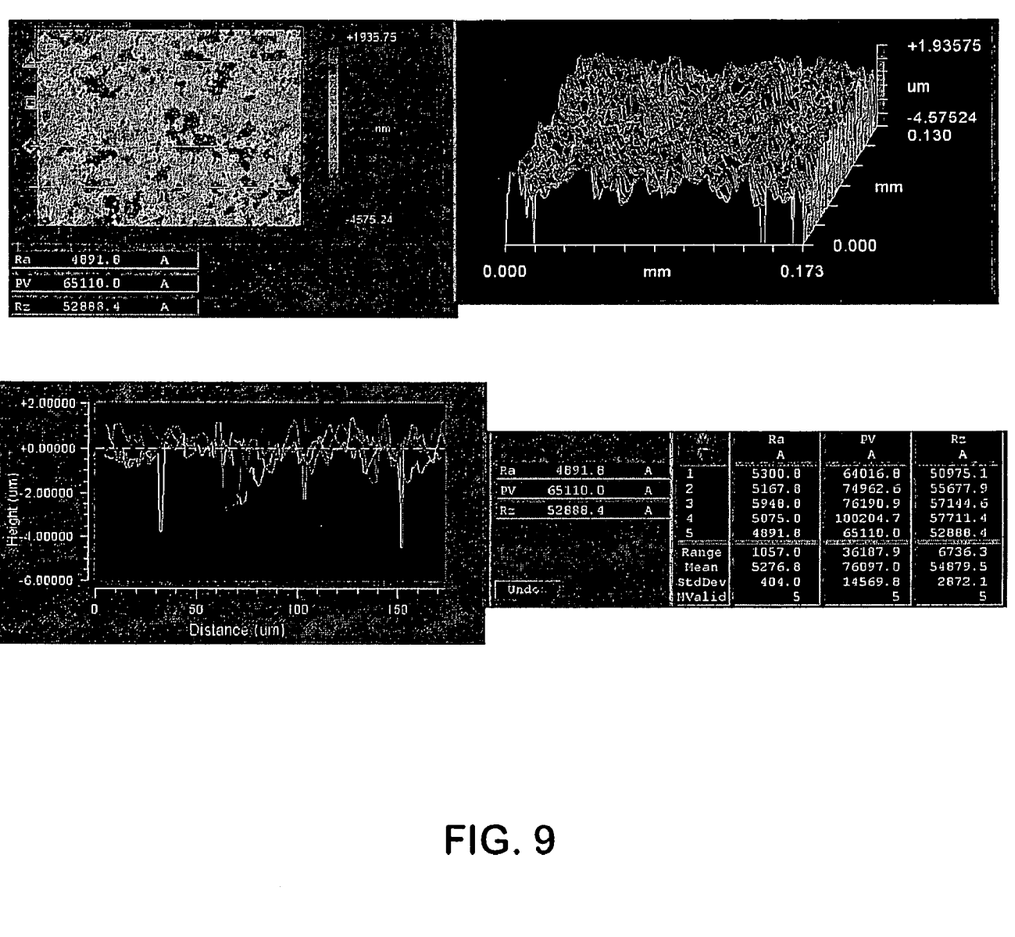
FIG. 9 is a copy of a screen display characterizing the roughness of a portion of a surface of a spinel wafer after lapping in accordance with one or more embodiments of the invention.

FIGS. 8 and 9 are copies of display screens characterizing the surface qualities of a portion of a wafer through the stages of processing of the invention as characterized by utilizing white light interferometric systems available from, for example, Zygo Corporation, Middlefield, Conn. In particular, FIG. 8 characterizes the surface roughness of a representative wiresaw roughcut wafer and FIG. 9 characterizes the surface quality of a representative lapped wafer.

The results presented in FIGS. 8 and 9 and as quantified in Table 5, show that by etching according to the invention, the surface qualities of wafers can be improved.

TABLE 5

| Description | TTV, μm | Taper, μm | TIR, μm | Warp, μm | Bow, μm |
|---|---|---|---|---|---|
| Not etched | 13.424 (1.911) | 3.936 (1.917) | 12.491 (1.865) | 12.491 (1.865) | 5.034 (1.196) |
| Etched | 9.165 (2.194) | 3.375 (1.651) | 8.175 (2.418) | 8.175 (2.418) | 2.782 (0.970) |
| Improvement with etching, % | 31.7 | 14.3 | 34.6 | 34.6 | 44.7 |

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only. Those skilled in the art would appreciate that the parameters and configurations described herein are exemplary and that actual parameters and/or configurations may depend on the specific application in which the articles, system, and techniques of the invention are used. Moreover, it should also be appreciated that the invention is directed to each feature, system, subsystem, or acts described herein and any combination of two or more such aspects, if such are not inconsistent, is considered to be within the scope of the invention as embodied in the claims.

What is claimed is:

1. A wafer consisting essentially of single crystal non-stoichiometric spinel and-having a surface that is substantially free of a defect zone and having a total thickness variation of less than about 10 μm and a taper of less than about 3.4 μm.

2. The wafer of claim 1 having a total thickness variation of less than about 5 μm.

3. The wafer of claim 1 having a total indicated reading of less than about 8.2 μm.

4. The wafer of claim 3 having a warp of less than about 8.2 μm.

5. The wafer of claim 4 having a bow of less than about 2.8 μm.

6. A spinel wafer having a taper of less than about 3.4 μm and a total indicated reading of less than about 8.2 μm.

7. The spinel wafer of claim 6 having a warp of less than about 8.2 μm.

8. The spinel wafer of claim 7 having a bow of less than about 2.8 μm.

* * * * *